United States Patent [19]
Ball

[11] 3,940,616
[45] Feb. 24, 1976

[54] MASS SPECTROMETERS

[76] Inventor: Geoffrey William Ball, Apple Patch, Bellingdon Road, Bellingdon, Chesham, Buckinghamshire, England

[22] Filed: Aug. 2, 1974

[21] Appl. No.: 494,278

Related U.S. Application Data

[62] Division of Ser. No. 217,600, Jan. 13, 1972, Pat. No. 3,840,742.

[52] U.S. Cl. .................................. 250/292; 250/423
[51] Int. Cl.² ..................... H01J 39/34; H01J 37/08
[58] Field of Search ........... 250/423, 424, 288, 292, 250/281, 282, 283

[56] References Cited

UNITED STATES PATENTS 3,639,757 2/1972 Caroll ................................ 250/288

*Primary Examiner*—Craig E. Church
*Attorney, Agent, or Firm*—Toren, McGeady and Stanger

[57] ABSTRACT

A mass spectrometer has an ion source in having two nested frusto-conical members between the narrow ends of which the splayed out end of an inlet pipe is disposed. The inner frusto-conical member is of mesh form and its wide end leads to the inlet of an ion filter. R.f. and d.c. are applied between the frusto-conical members. The ion filter has four elongate hyperbolic plates of conductive material supported within a tubular ceramics support member. The elongate hyperbolic plates are symmetrical with respect to an axis towards which they project and define a passage within the support member. The outlet of the filter leads to an ion detector.

2 Claims, 2 Drawing Figures

MASS SPECTROMETERS

Figure 1:
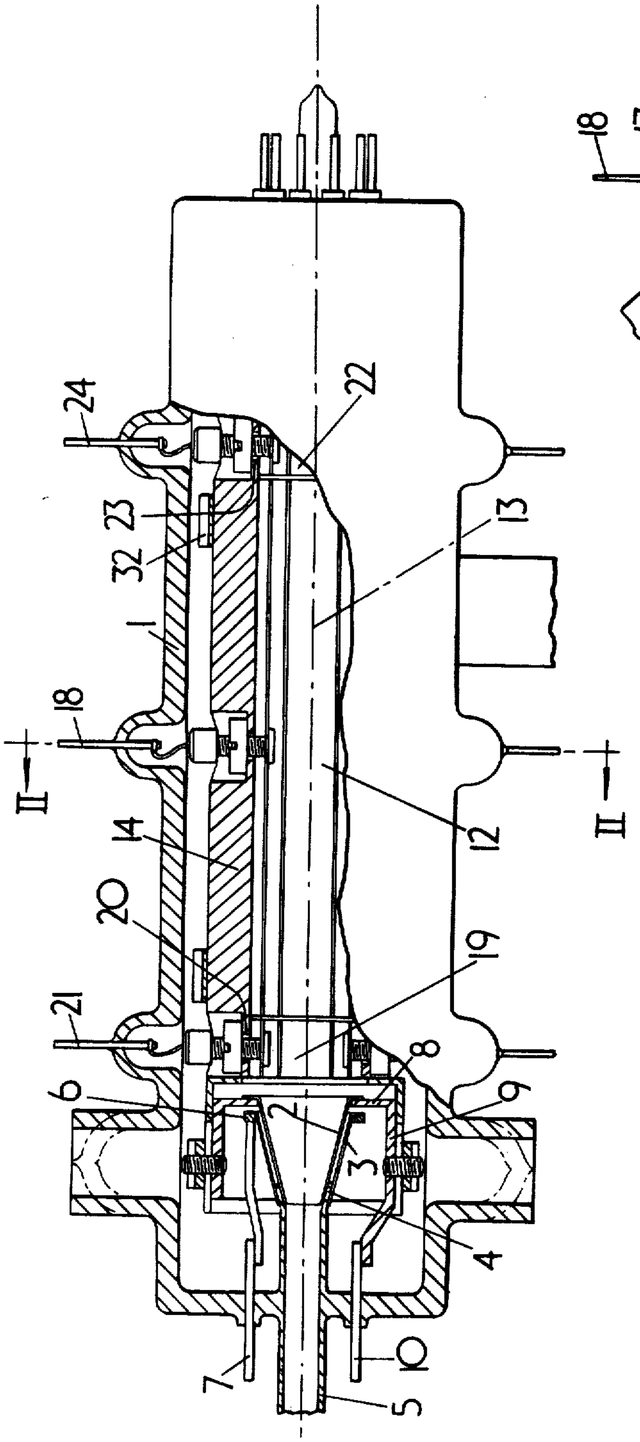

This is a divisional application of application Ser. No. 217,600 filed Jan. 13, 1972 now U.S. Pat. No. 3,840,742.

This invention relates to mass spectrometers.

A mass spectrometer comprises an ion source, an ion filter, and an ion detector. A gas at a low pressure is introduced into the ion source which ionizes it and ions having the required e/m ratio pass through the ion filter and are detected by the ion detector. The e/m ratio of the ions selected by the ion filter can be varied so that the gas introduced into the ion source may be analysed.

The ion source generally comprises means for generating a stream of electrons which are arranged to impinge upon the molecules of the gas to be analysed and to thereby ionize them.

One known type of ion filter comprises four parallel conductive rods symmetrically placed about an axis along which ions pass, r.f. and d.c. being fed to the four rods. The e/m ratio of the selected ions is defined, inter alia, by the magnitudes of the r.f. and d.c. and may be varied by varying those magnitudes. This type of ion filter is known as a quadrupole filter and it is known to vary the magnitudes of the r.f. and d.c. by a sweep signal which is also fed to the X-X plates of an oscilloscope, the output of the ion detector being fed to the Y-Y plates of the oscilloscope.

The ion detector generally consists of an electron multiplier having a plurality of plates.

It is an object of this invention to provide an improved mass spectrometer.

According to a first aspect of this invention, there is provided a mass spectrometer comprising an ion source, an ion filter and an ion detector, the ion source comprising two nested frusto-conical members the inner of which is in mesh form, the wider ends of the inner frusto-conical members being adjacent to the entry to the ion filter, and a passage for introducing a gas to be ionized, the passage being connected to the narrower end of the inner frusto-conical member.

In use, r.f. and d.c. are applied between the two frusto-conical members, the inner member being earthed. The gas introduced into the inner frusto-conical member passes through the inner frusto-conical member into the space between the two frusto-conical members. At the peaks of the r.f. waveform the molecules of gas in that space are ionized and the forces generated by the r.f. and d.c., which act on those ions, are in the sense to urge those ions axially towards the wider ends of the two members so that the ions pass through the inner frusto-conical member, and through its open end and, if they have the right e/m ratio, through the ion filter.

Preferably the splayed out end of an inlet pipe for gas to be ionized is disposed between the narrow end of the frusto-conical members.

According to a second aspect of this invention there is provided a mass spectrometer comprising an ion source, an ion filter, and an ion detector, the ion filter comprising at least one elongated hyperbolic plate of conductive material the or each elongated hyperbolic plate being supported within a tubular support member of insulating material so as to define a passage within the tubular support member.

Preferably a number of elongated hyperbolic plates are provided, the number being four or a multiple thereof, the elongated hyperbolic plates being symmetrically disposed about, and projecting towards an axis within the tubular support member.

In use, r.f. and d.c. are applied to the or each elongated plate, the hyperbolic shape being the optimum shape.

Preferably an elongated flat plate is secured symmetrically to the or each plate on its concave side, that elongated hyperbolic plate being secured to the tubular support member by a fixing device which extends through an aperture in the support member and is secured to the flat plate.

Preferably the fixing device is a bolt which is screwed into a nut carried by or formed in the flat plate.

Preferably the internal passage of the tubular support has a plurality of sides equal in number to the plates, the elongated plates being in register with respective sides of the passage.

Preferably a projecting rib is formed at the junction of each pair of sides, the opposed elongated edges of each elongated plate being in enagement with the corners formed by ribs at the edges of the side with which that elongated plate is in register.

Preferably, the ion detector comprises an electron multiplier having a plurality of plates or grids which are capacitively coupled, there being provided a control plate or grid at the entry to the electron multiplier associated with means for applying a d.c. potential of either polarity to the control plate or grid for controlling the output of the electron multiplier.

Preferably the mass spectrometer is of unitary construction.

Figure 2:
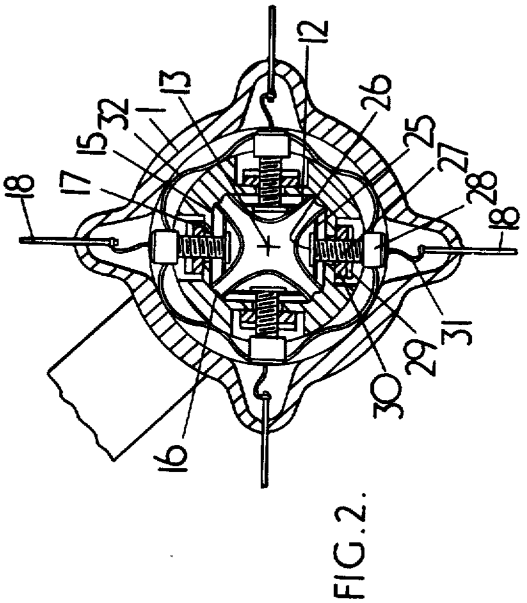

An electron multiplier in accordance with this invention will now be described, by way of example only, with reference to the accompanying drawings of which:

FIG. 1 is an elongated sectional elevation of a mass spectrometer in accordance with this invention; and FIG. 2 is a sectional elevation on the line II—II of FIG. 1.

The mass spectrometer is of unitary construction and has an outer housing 1 of glass. As seen in FIG. 1, an ion source is formed at the left hand end, an ion filter in the central part, and an ion detector at the right hand end of the mass spectrometer. The ion source comprises two nested frusto-conical members 2 and 3 of metallic material, the inner member 2 being in the form of mesh. The narrower ends of the two members 2 and 3 surround the splayed out end 4 of a pipe 5 integral with the housing 1. The pipe 5 serves to supply a gas which is to be analysed and which is at a low pressure. The wide end of the inner member 2 registers with the entry to the ion filter which will be described later. The wide end of the outer member 3 is flanged on to a metallic ring 6 which is connected to a lead 7 extending out of the casing 1. The wide end of the inner ring 2 is secured to a flange 8 formed on a hollow cylinder 9, which is of metallic material and which is connected to a lead 10 extending outside the casing 1.

The ion filter comprises four elongated hyperbolic plates 12 which are symmetrical about, and project towards, an axis 13 which is colinear with the axis of the pipe 5 and of the members 2 and 3. The four elongated plates 12 are supported by a cylindrical support member 14 having a generally square passage 15 therein. The corners of the passage 15 are stepped inwardly as indicated at 16 to provide approximate location for the elongated hyperbolic plates 12.

At its mid-point the cylindrical support 14 is formed with four symmetrically disposed apertures 17 in line with the elongated plates 12. There is symmetrically secured to each plate 12 on its concave side, i.e. the side facing its associated aperture 17, an elongated flat plate 25 to which a nut 26 is welded. A 4BA fixing stud 27 extends through each aperture 17, is screwed into the nut 26, and carries an end cap 28. The stud 27 also carries a nut 29 and a washer 30 which rests against the cylindrical support 14. A lead 18 is connected to the end cap 28 by a wire 31 and passes through the casing 1 so that each stud 27 acts to secure one of the plates 12 to the support member 14 and also to provide an electrical connection to the plate 12. At the ends of the ion filter adjacent to the ion source and the ion detector respectively there are formed a pre-filter and a post-filter respectively. The pre-filter comprises four hyperbolic plates 19 which are shorter than, but are otherwise identical to, the plates 12. These plates 19 are secured to the cylindrical support member 14 in a manner identical to that in which the plates 12 are secured to the support member 14 using studs which pass through apertures 20 and are electrically connected to the leads 21. The post-filter is similar to the pre-filter and comprises short hyperbolic plates 22, apertures 23 and leads 24 which correspond to the short hyperbolic plates 19, apertures 20 and leads 21 respectively.

The leads 21 and 24 are connected to the respective leads 18 through capacitors which are not shown.

The plates 12, 19 and 22 are of stainless steel but could be of any other conductive non-magnetic material. The cylindrical support member 14 is of aluminium ceramic but could be of any other insulating material. The support member 14 is supported within the casing 1 by supports 32 in the form of circular crinkle springs.

The ion detector is not shown in section in FIG. 1 but comprises an electron multiplier having a plurality of aligned grids as is conventional with the grids coupled capacitively so as to pass r.f. At the entry to the electron mutliplier, which operates on the basis of secondary emission, there is provided a control grid or plate to which a variable positive or negative d.c. potential is applied.

Three vacuum pumps are connected to the mass spectrometer.

In use, the gas to be analysed is introduced into the ion source through the pipe 5. The lead 10 is earthed whereas r.f. and d.c. are applied to the lead 7. The molecules of gas pass through the member 2, which is in the form of a mesh, to the space between the members 2 and 3 and are there ionized at the positive peaks of the r.f. The resultant ions are urged axially towards the open end of the member 2 by the combined r.f. and d.c. signal and enter the ion filter.

The plates 12 form the central part of the ion filter and to these plates r.f. and d.c. are applied so that the lead can be connected directly to one of the leads 18. The central part of the ion filter selects ions of the required e/m ratio, that is to say, it only allows such ions to pass through the filter. As the pre-filters and post-filters are capactively coupled to the central part of the ion filter only r.f. is applied to them and consequently they allow all ions to pass through. The purpose of providing the pre-filters and post-filters is to eliminate the end effects which would otherwise appear at the ends of the plates 12 and thereby prevent some ions with the required e/m ratio passing through the ion filter.

The ion detector detects the number of ions and its output is fed to an amplifier.

As the output of the detector is dependent on the phase of the r.f. signal and as the number of ions is proportional to the phase of the r.f. applied to the ion source, it is desirable that the amplifier should be followed by a phase sensitive detector to which the r.f. signal is applied.

The mass spectrometer in accordance with this invention is small and is relatively cheap because it is of unitary construction having a single housing 1.

In a modification eight or 12 plates 12 are used and the support 14 has a corresponding internal shape. In a further modification only one plate 12 is employed and the ion filter is of the monopole type.

The cylindrical support 14 is extruded oversize, is then hydrostatically pressed in a machine tool and the apertures 17 are then formed by machining. Subsequently the support 14 is fired in a gradient temperature controlled tunnel kiln to give steady shrinkage without distortion or cracking.

I claim:

1. A mass spectrometer comprising an ion source, an ion filter and an ion detector, the ion source including two nested frusto-conical members, the inner member being in mesh form, the wider end of the inner frusto-conical member being adjacent the entry to the ion filter, a member containing a passage for introducing a gas to be ionized, said passage member being connected to the narrower end of the inner frusto-conical member, a source of r.f., the output of which is applied between the frusto-conical members, and a source of d.c., the output of which is applied between the frusto-conical members.

2. A mass spectrometer as claimed in claim 1 wherein the splayed out end of an inlet pipe for gas to be ionized is disposed between the narrow ends of the frusto-conical members.

* * * * *